US008593261B2

United States Patent
Takagi et al.

(10) Patent No.: US 8,593,261 B2
(45) Date of Patent: Nov. 26, 2013

(54) TOOL MANAGEMENT METHOD OF DIE BONDER AND DIE BONDER

(75) Inventors: Susumu Takagi, Kumagaya (JP); Hiroshi Maki, Kumagaya (JP)

(73) Assignee: Hitachi High-Tech Instruments Co., Ltd., Kumagaya-shi (JP)

( * ) Notice: Subject to any disclaimer, the term of this patent is extended or adjusted under 35 U.S.C. 154(b) by 352 days.

(21) Appl. No.: 13/043,820

(22) Filed: Mar. 9, 2011

(65) Prior Publication Data

US 2012/0075079 A1 Mar. 29, 2012

(30) Foreign Application Priority Data

Sep. 24, 2010 (JP) ................................. 2010-213207

(51) Int. Cl.
*H04Q 5/22* (2006.01)

(52) U.S. Cl.
USPC ....................................................... 340/10.51

(58) Field of Classification Search
USPC ......... 340/10.51, 12.23, 12.51, 505; 438/612, 438/22, 106
See application file for complete search history.

(56) References Cited

U.S. PATENT DOCUMENTS 7,567,179 B2 * 7/2009 Stephensen et al. ....... 340/572.1

FOREIGN PATENT DOCUMENTS

JP 2005-32828 A 2/2005

* cited by examiner

*Primary Examiner* — Vernal Brown
(74) *Attorney, Agent, or Firm* — Crowell & Moring LLP

(57) ABSTRACT

RFID tags are attached to tools of a preform head, a bonding head, and a push-up unit, and information related to each tool such as a dimension of a processing-target die is stored into the RFID tags. When a tool is mounted, an operator inputs manufacturing conditions related to the tool. When information related to the tool read from the RFID tag by an RFID reader/writer and the manufacturing conditions related to the tool do not match each other, a message about wrong mounting of the tool is displayed on a monitor. Further, an operation history of the tool is written into the RFID tag by the RFID reader/writer when the production is completed. The operation history is read when the next production is started, and if the values of the operation history exceed predetermined numbers of times, a message is displayed on the monitor.

13 Claims, 15 Drawing Sheets

FIG. 8A
FIG. 8B
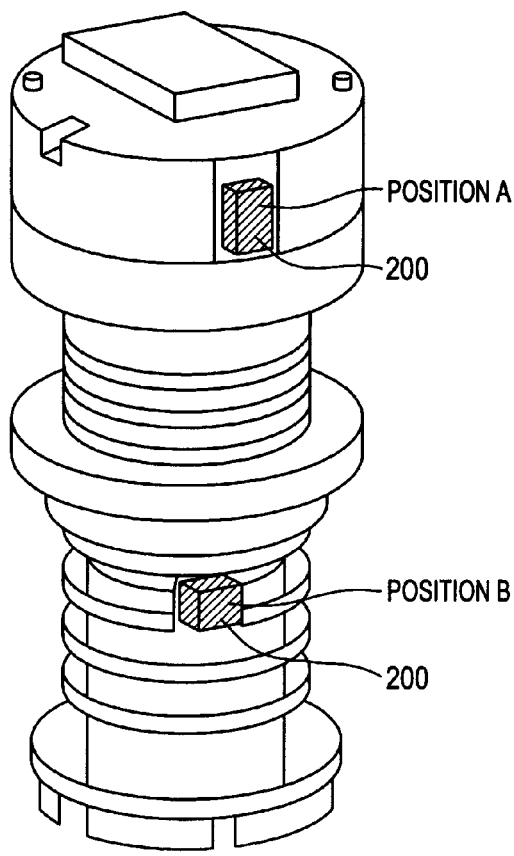
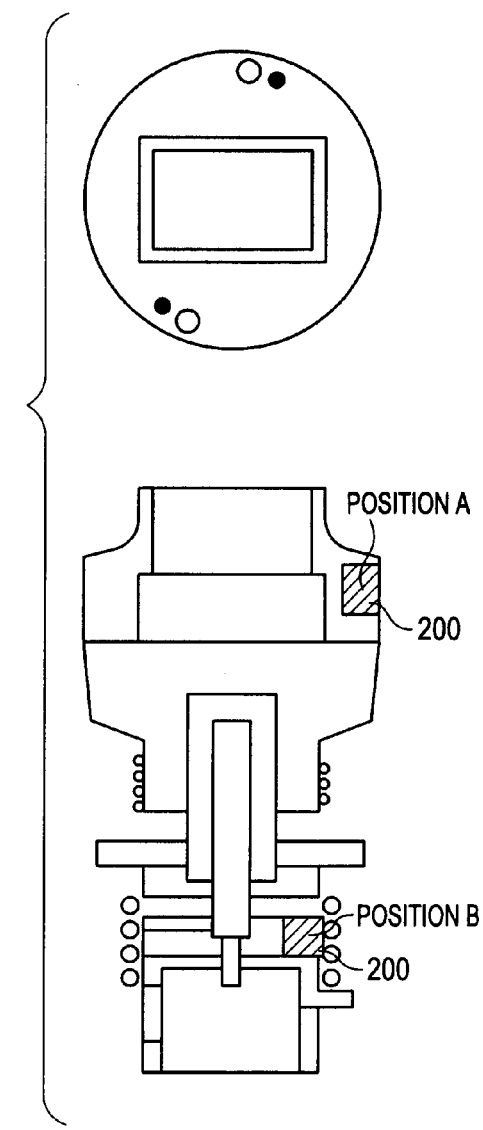

FIG. 11A

| TAG SERIAL NO. | TYPE OF TOOL | TARGET PRODUCT | DIMENSION OF DIE | MATERIAL | TEACHING DATA | MESSAGE WHEN MOUNTED |
|---|---|---|---|---|---|---|
| tag00201 | BONDING HEAD | A0021 | 5mm X 7mm | SUS | 5mm IN Z DIRECTION | PLEASE SCREW TIGHTLY |
| tag52142 | PREFORM HEAD | C2311 | 7mm X 8mm | BRS | | PLEASE BE CAREFUL OF TIP BREAKING |
| tag15936 | PUSH-UP UNIT | D4891 | 7mm X 8mm | SUS | | |
| tag53289 | BONDING HEAD | E0135 | 10mm X 15mm | SUS | 7mm IN Z DIRECTION | |

FIG. 11B

| NUMBER OF STEPS | NUMBER OF ERRORS | OPERATING TIME (HOUR) | NUMBER OF PICKUP FAILURES |
|---|---|---|---|
| 2501 | 0 | 1 | 0 |
| 700012 | 2 | 583 | — |
| 320510 | 1 | 267 | 0 |
| 1543267 | 5 | 1286 | 2 |

FIG. 12

| TYPE OF TOOL | NUMBER OF STEPS (TENS OF THOUSANDS OF TIMES) | NUMBER OF ERRORS (TIMES/DAY) | OPERATING TIME (HOUR) | NUMBER OF PICKUP FAILURES (TIMES/DAY) | WARNING LEVEL |
|---|---|---|---|---|---|
| BONDING HEAD | 100 | 4 | 1000 | 2 | A |
| PUSH-UP UNIT | 150 | 3 | 1500 | 2 | A |
| PREFORM HEAD | 200 | 2 | 2500 | - | A |
| BONDING HEAD | 200 | 8 | 2000 | 4 | B |
| BONDING HEAD | 300 | 12 | 3000 | 6 | C |

FIG. 17

| TAG SERIAL NO. | TYPE OF TOOL | NUMBER OF STEPS | NUMBER OF ERRORS | OPERATING TIME | NUMBER OF PICKUP FAILURES |
|---|---|---|---|---|---|
| tag00302 | BONDING HEAD | 300204 | 2 | 250 | 1 |
| tag01425 | PREFORM HEAD | 252321 | 3 | 210 | - |
| tag54221 | PUSH-UP UNIT | 47521 | 1 | 40 | 0 |

TOOL MANAGEMENT METHOD OF DIE BONDER AND DIE BONDER

CLAIMS OF PRIORITY

The present application claims priority from Japanese patent application serial no. JP2010-213207, filed on Sep. 24, 2010, the content of which is hereby incorporated by reference into this application.

BACKGROUND OF THE INVENTION

The present invention relates to a tool management method of a die bonder and a die bonder, and particularly to a method suitable for improving the production capability of a production line using a die bonder by managing tools that are replaceable in accordance with a semiconductor chip mounted by a die bonder to prevent wrong operations at the time of production.

A die bonder is a device by which semiconductor integrated circuits (semiconductor chips and dies) are mounted on a printed substrate.

As a procedure of mounting a semiconductor chip on a printed substrate by the die bonder, a position (die pad) of the printed substrate on which the semiconductor chip is mounted is, at first, coated with a paste (adhesive) by a preform head.

On the other hand, a plurality of same patterns are formed on a semiconductor wafer, the semiconductor wafer is cut off and separated from each other for singulation as semiconductor chips, and the array of the semiconductor chips is maintained by a sheet of the semiconductor wafer. Then, a bonding head is moved downward from the upper side of the semiconductor wafer and a pin of a push-up unit is pushed up from the lower side to separate the semiconductor chip from the sheet by collaborative work of the both, so that a collet of the bonding head is allowed to suck the semiconductor chip. Thereafter, the bonding head is moved on the die pad, and the semiconductor chip is placed on the die pad for bonding.

In such a die bonder, tools of the preform head, the bonding head, and the push-up unit are replaceable in order to adapt to various types of semiconductor chips mounted on the printed substrate.

For example, Japanese Patent Application Laid-Open No. 2005-32828 discloses a technique in which a trajectory of a bonding head is changed in accordance with the size of a semiconductor chip.

As described above, it is necessary to replace and mount the tools of the preform head, the bonding head, and the push-up unit in the die bonder in accordance with the semiconductor chip mounted on the printed substrate. At this time, in order to confirm whether or not a mounted tool is adapted to a product to be produced, an operator himself or herself has visually checked a number given to the tool and the shape of the tool.

If a wrong tool that is not adapted to a product is mounted, the die bonder device stops. Alternatively, even if the die bonder device is able to run, there occur problems such as deterioration in quality or breaking of the printed substrate and the semiconductor chip in the worst case. There has not been provided a scheme of checking wrong mounting of tools by an operator from the past.

Further, there is a possible management method in which a bar code is attached to a tool and is read by a bar-code reader when the tool is mounted.

However, the use of the bar code forces an operator to read the bar code every time the tool is mounted. In addition, the ID of the bar-code needs to be associated with the specification of the tool to be held as a table, causing a problem in management of tool information that is increasing from day to day. Further, history information of production using the tool cannot be stored into the bar code.

The present invention has been achieved to solve the above-described problems, and an object thereof is to provide a tool management method of a die bonder in which tools are automatically managed to lighten the work load of an operator, and wrong mounting of the tools is prevented to realize advanced production management in a die bonder in which the tools are replaceable.

SUMMARY OF THE INVENTION

A die bonder according to a tool management method of a die bonder of the present invention allows a die of a semiconductor integrated circuit on a semiconductor wafer to be mounted on a printed substrate, and a part of a preform head by which a printed substrate is coated with a paste to bond a die, a part of a bonding head which picks up the die from a semiconductor wafer to be supplied to the printed substrate, and a part of a push-up unit which pushes up the die from the lower side when the bonding head picks up the die are replaceable as tools.

Further, an RFID tag is attached to each of the tool of the preform head, the tool of the bonding head, and the tool of the push-up unit, and information related to each tool to which the RFID tag is attached is stored in the RFID tag.

The tool of the preform head, the tool of the bonding head, and the tool of the push-up unit are mounted in the die bonder before production in accordance with a printed substrate to be manufactured.

On the other hand, an operator inputs information of the processing-target die of each tool through an input device such as a keyboard or a touch panel. The input information of the processing-target die of each tool is held by a RAM, and an RFID reader/writer reads the information stored in the RFID tag attached to each tool. Then, an operational device compares the information of the processing-target die of each tool that is stored in the memory with the information related to each tool stored in the RFID tag attached to each tool. If the comparison result between the information of the processing-target die of each tool that is stored in the memory and the information related to each tool stored in the RFID tag attached to each tool shows that the both do not match each other, a CPU allows a display device to display a determination result related to mounting of the tool.

Here, the information related to each tool includes a type of tool, a product name of a semiconductor wafer, a dimension of a die, and a material of a tool.

Further, the die bonder collects an operation history of each tool to be held in the RAM, and information related to operations of each tool read from an HDD or the like is also held in the RAM.

Further, the CPU instructs the RFID reader/writer to write an operation history of each tool into the RFID tag attached to each tool when the production is completed, and the RFID reader/writer writes the operation history of each tool into the RFID tag attached to each tool on the basis of the instruction of the CPU.

Then, when the RFID reader/writer reads the information stored in the RFID tag attached to each tool, the RFID reader/writer reads the operation history of each tool, and the CPU compares information related to operations of each tool that is held in the RAM with the operation history of each tool stored in the RFID tag attached to each tool. If the comparison result shows that the values of the operation history exceed those of the information related to operations of each tool, the CPU displays information related to use of each tool on a monitor.

BRIEF DESCRIPTION OF DRAWINGS

FIG. 8A is a perspective view for showing an example in which RFID tags 200 are embedded into the tool of the push-up unit 50;

FIG. 8B are a top view and a cross-sectional view for showing an example in which the RFID tags 200 are embedded into the tool of the push-up unit 50;

FIG. 11A is a diagram for showing an example of information held by the RFID tag 200 (part 1);

FIG. 11B is a diagram for showing an example of information held by the RFID tag 200 (part 2); FIG. 12 is a diagram for showing an example of a warning level table 500;

FIG. 17 is a diagram for showing an example of an operation history table 501.

DESCRIPTION OF THE PREFERRED EMBODIMENT

Hereinafter, a tool management method of a die bonder according to each embodiment of the present invention will be described using FIG. 1 to FIG. 17.

[First Embodiment]

Hereinafter, a tool management method of a die bonder according to a first embodiment of the present invention will be described using FIG. 1 to FIG. 16.

In the first place, a structure of the die bonder according to the first embodiment of the present invention will be described using FIG. 1 to FIG. 8B.

Figure 1:
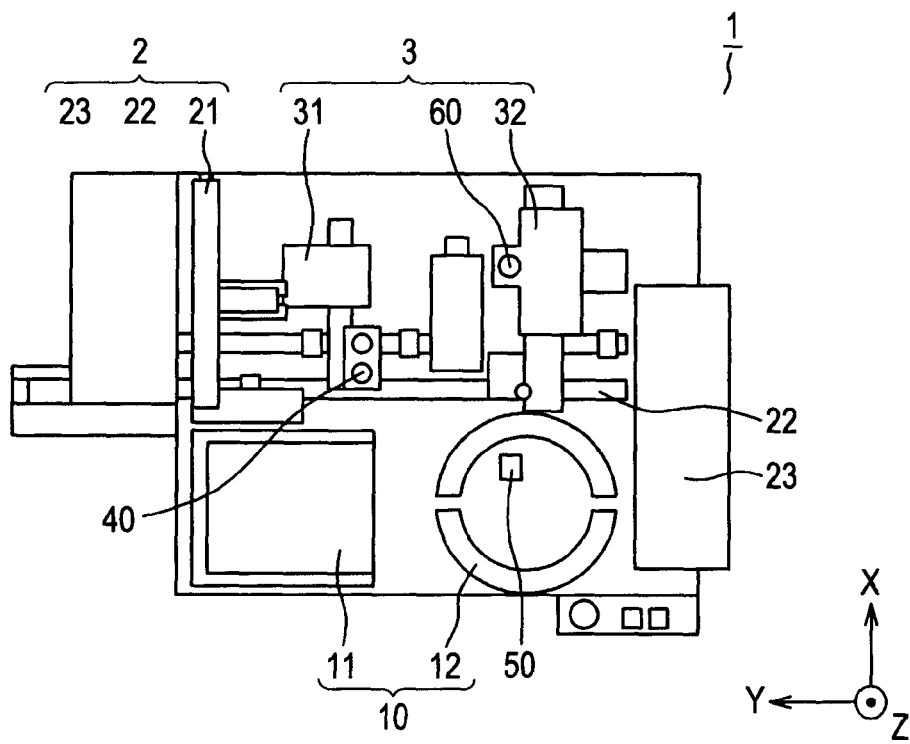
FIG. 1 is a top view of a die bonder according to a first embodiment of the present invention.

FIG. 1 is a top view of a die bonder according to a first embodiment of the present invention.

Figure 2:
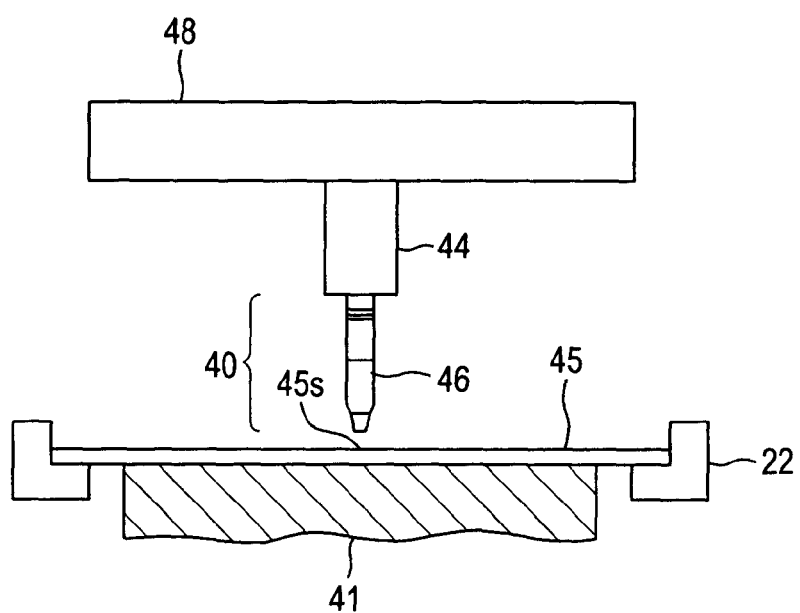
FIG. 2 is a side view of a preform unit 31.

FIG. 2 is a side view of a preform unit 31.

Figure 3:
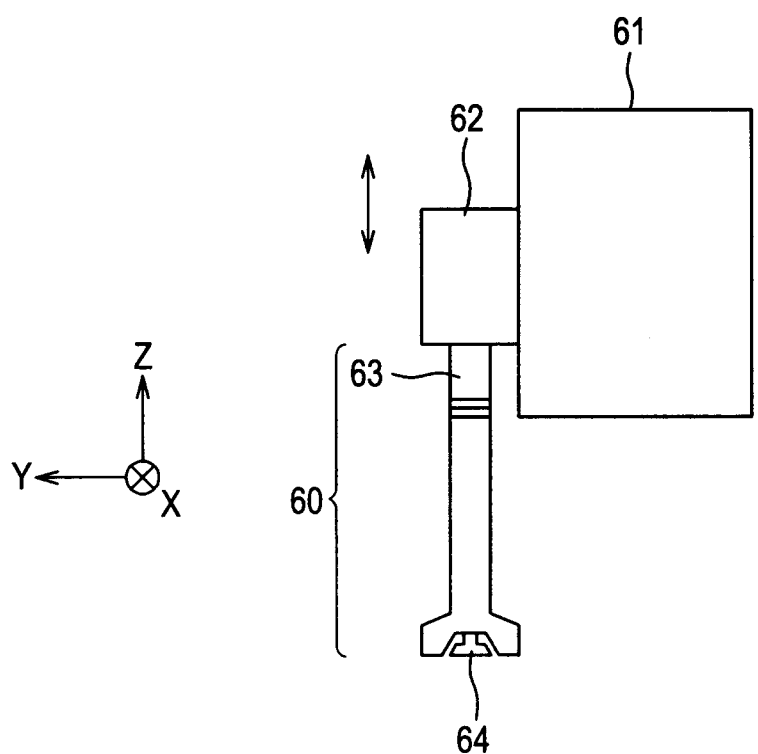
FIG. 3 is a side view of a bonding head unit 32.

FIG. 3 is a side view of a bonding head unit 32.

Figure 4:
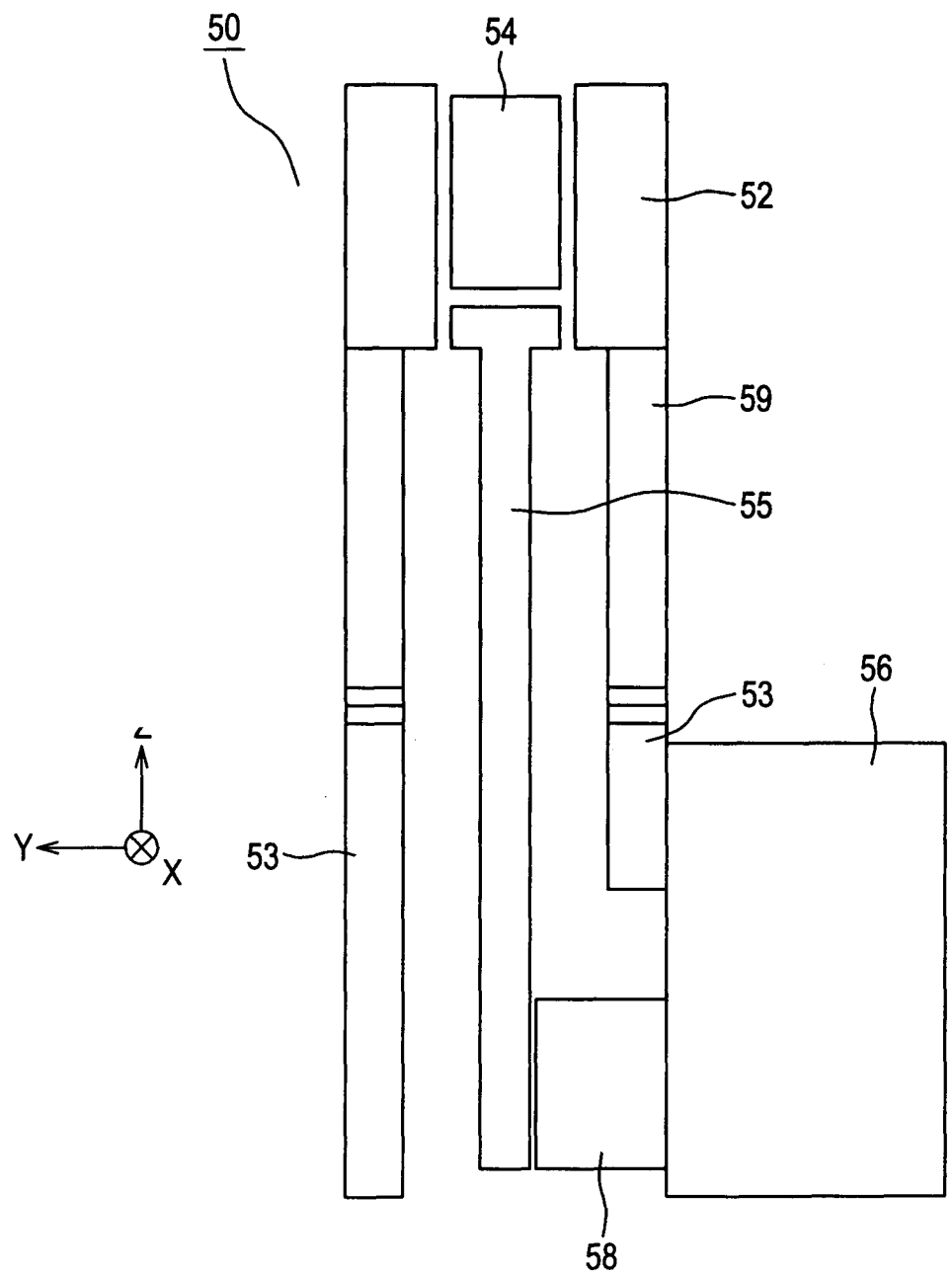
FIG. 4 is a cross-sectional view of a push-up unit 50.

FIG. 4 is a cross-sectional view of a push-up unit 50.

Figure 5:
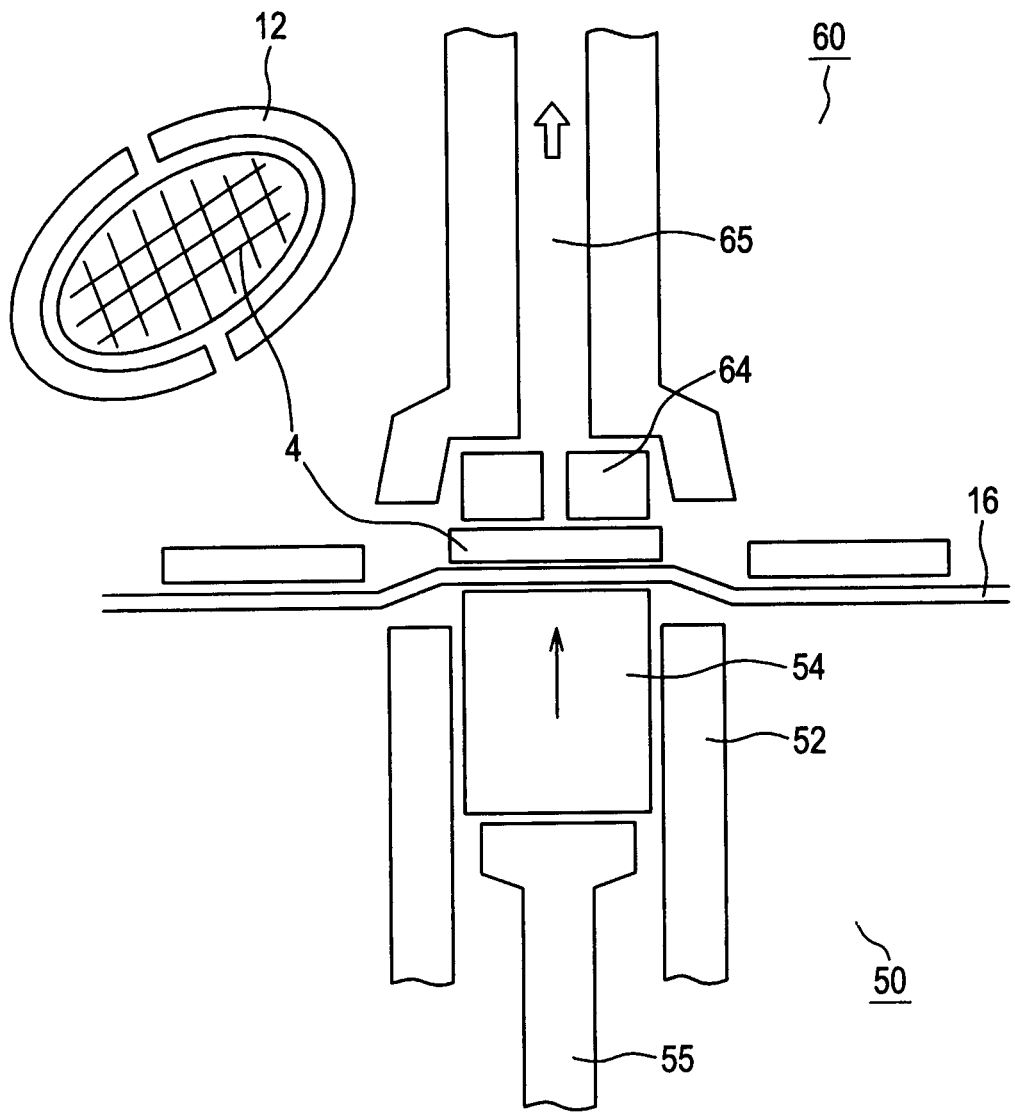
FIG. 5 is a cross-sectional view when a die is picked up from a wafer by the bonding head unit 32 and the push-up unit 50.

FIG. 5 is a cross-sectional view when a die is picked up from a wafer by the bonding head unit 32 and the push-up unit 50.

Figure 6:
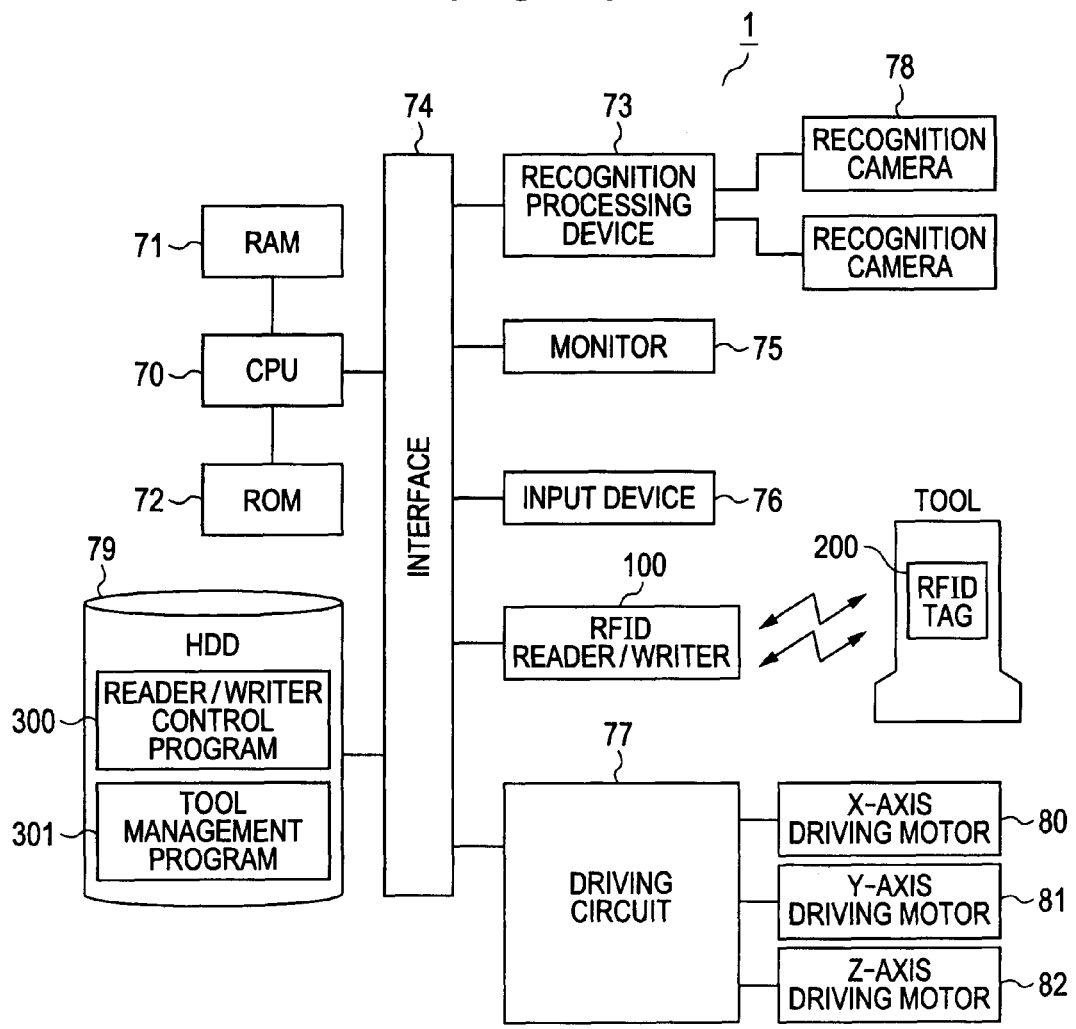
FIG. 6 is a functional block diagram of the die bonder according to the first embodiment of the present invention.

FIG. 6 is a functional block diagram of the die bonder according to the first embodiment of the present invention.

Figure 7:
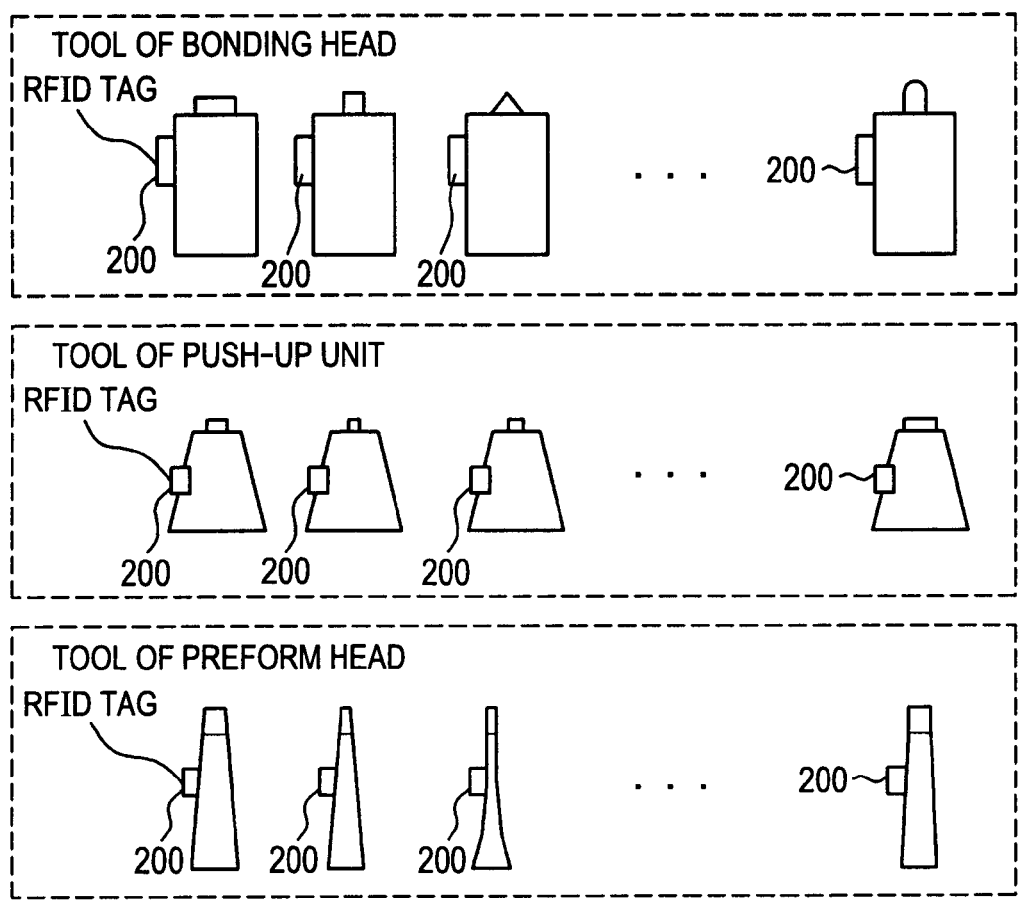
FIG. 7 is a pattern view in which an RFID tag is installed in each tool.

FIG. 7 is a pattern view in which an RFID tag is installed in each tool.

FIG. 8A is a perspective view for showing an example in which RFID tags 200 are embedded into the tool of the push-up unit 50.

FIG. 8B are a top view and a cross-sectional view for showing an example in which the RFID tags 200 are embedded into the tool of the push-up unit 50.

A die bonder 1 roughly includes a wafer supplying unit 10, a work supplying/delivering unit 2, and a die bonding unit 3.

The wafer supplying unit 10 includes a wafer cassette lifter 11 and a wafer ring holder 12. The wafer cassette lifter 11 includes a wafer cassette (not shown) into which a wafer ring is loaded, and supplies the wafer ring to the wafer ring holder 12. The wafer ring holder 12 stretches a sheet holding the wafer ring downward to widen intervals between dies so that the dies can be easily picked up at the time of a bonding process. In addition, the wafer ring holder 12 is arranged on an X-Y direct operated table, is directly moved to the position of the next die after pickup, and waits for the next pickup.

The work supplying/delivering unit 2 includes a stack loader 21, a frame feeder 22, and an unloader 23. A work (lead frame) supplied to the frame feeder 22 by the stack loader 21 is delivered to the unloader 23 through two processing positions on the frame feeder.

The die bonding unit 3 includes a preform unit 31 and a bonding head unit 32. The preform unit 31 allows a preform head 40 to coat the work delivered by the frame feeder 22 with a die paste.

The bonding head unit 32 allows a bonding head 60 and a push-up unit to be vertically attached to each other, and is moved upward after the die of a wafer in the wafer ring holder 12 is sucked and picked up by a collet of the bonding head 60. Then, the die is horizontally moved to a bonding point on the frame feeder 22. Thereafter, the bonding head unit 32 moves the bonding head 60 downward, and bonds the die onto the work coated with the die paste.

As shown in FIG. 2, the preform unit 31 includes a needle 46 by which a paste coating surface 45s of a work such as a lead frame 45 is coated with a paste, a Z-axis driving unit 44 which allows the needle 46 to be horizontally and vertically moved on the drawing, and a fixed base 48 which fixes an imaging camera (not shown) and holds a rail (not shown) that allows the Z-axis driving unit 44 in the horizontal direction on the drawing.

A tool of the preform head 40 can be detached from a main shaft 49 of the Z-axis driving unit 44, and can be replaced depending on a type of die to be mounted.

It should be noted that the lead frame 45 is delivered by the frame feeder 22 configuring the work supplying/delivering unit 2, and is held on a stage 47.

As shown in FIG. 3, the bonding head 60 is attached to a Z-axis driving unit 62, and can be moved in the vertical direction. The Z-axis driving unit 62 is mounted on an X-Y stage 61, and can be moved in the X and Y directions.

A collet 64 is attached to a tip end of the bonding head 60 where the die is sucked by the air of a sucking pipe (not shown).

A tool of the bonding head 60 can be detached from a main shaft 63 attached to the Z-axis driving unit 62.

As shown in FIG. 4, the push-up unit 50 includes an outer block 52 and an inner block 54 at its tip end, and allows a piston 55 to push and vertically move the inner block 54. The piston 55 drives the inside of a liner 59 with a piston driving unit 58. The piston driving unit 58 is mounted on a fixed base 56.

A tool of the push-up unit 50 can be detached from a main shaft 53 of the fixed base 56.

When a die 4 of the wafer mounted in the wafer holder 12 is picked up, the wafer holder 12 is moved to a predetermined pickup position. Then, a tip end of the bonding head 60 is allowed to come close to the wafer holder 12 from the upper side and a tip end of the push-up unit 50 is allowed to come close to the wafer holder 12 from the lower side as shown in FIG. 5. Then, the collet 64 of the bonding head 60 is allowed to be brought into contact with the die 4, and the die 4 is sucked by the air of a sucking pipe 65 inside the bonding head 60. At the same time, the piston 55 pushes up the inner block 54 of the push-up unit 50, and the die 4 is separated from a sheet 16 by collaborative work of the bonding head 60 and the push-up unit 50. Thereafter, the bonding head 60 is allowed to be further moved upward, so that the die 4 sucked by the collet 64 is picked up.

FIG. 6 shows control blocks of the die bonder 1 of the embodiment.

A CPU (Central Processing Unit) 70 (operational device) controls the die bonder 1, and executes a necessary program by issuing instructions to respective units. A RAM (Random Access Memory) 71 that is a volatile memory and a ROM (Read Only Memory) 72 that is a nonvolatile memory are semiconductor storage devices coupled to the CPU 70 through bus lines. Various programs for controlling the die bonder may be stored in the ROM 72.

For the tool management method of the die bonder 1 of the embodiment, a reader/writer control program 300 and a tool management program 301 are stored in an auxiliary storage device such as an HDD (Hard Disk Drive) 79, and are loaded to the RAM 71 to be executed by the CPU 70. The reader/writer control program 300 is a control program for performing communications of data with an RFID reader/writer 100. The tool management program 301 is a program by which information written in an RFID tag 200 is read and information necessary for an operator of the die bonder 1 is displayed based on the read information, or operation information of a tool is written into the RFID tag 200 installed in the tool as a target of the die bonder.

Further, various programs for controlling the die bonder 1 may be stored in not the ROM 72 but the HDD 79.

Then, the CPU 70 controls operations of mounting components of the die bonder overall, in accordance with the program stored in the ROM 72 or the program loaded from the HDD 79 on the basis of data stored in the RAM 71. The CPU 70 controls to drive an X-axis driving motor 80, a Y-axis driving motor 81, a Z-axis driving motor 82, and the like through a driving circuit 77 on the basis of the stored control programs for controlling the operations of the die bonder.

A recognition processing unit 73 is coupled to the CPU 70 through an interface 74. A recognition process of an image retrieved after being imaged by a recognition camera 78 is performed by the recognition processing unit 73, and the processing result is transmitted to the CPU 70.

A monitor 75 is a display device for displaying a screen for tool management information and various data settings.

An input device 76 is a device, such as a touch panel, a keyboard, or a mouse, for inputting information into the die bonder.

The RFID reader/writer 100 is a device serving as an intermediary of the CPU 70 in order to read information stored in the RFID tag 200 installed in each tool, or to store information into the RFID tag 200 by using a radio signal in a predetermined frequency band. Although not illustrated in FIG. 1, the RFID reader/writer 100 is installed at an appropriate position within a range where electric waves of the preform head 40, the bonding head 60, and the push-up unit 50 can reach.

In the tool management method of the die bonder 1 according to the embodiment, the RFID tags 200 are embedded into the tools of the preform head 40, the bonding head 60, and the push-up unit 50 as shown in FIG. 7. The RFID tags 200 can be embedded by mechanical processing or through a paste.

The size of the die bonder 1 itself is 1.5 m to 2 m square, and the UHF band or the HF band can be used as the frequency band of communications between the RFID reader/writer 100 and the RFID tags 200.

For example, grooves may be provided at a position A and a position B in the tool of the push-up unit 50 as shown in FIG. 8A and FIG. 8B to install the RFID tags 200 by using a paste. The RFID tags are installed so that the position A is intended to manage components at a tip end of the tool, and the position B is intended to manage the entire tool.

Next, structures and operations of the RFID reader/writer 100 and the RFID tag 200 will be described using FIG. 9 and FIG. 10.

Figure 9:
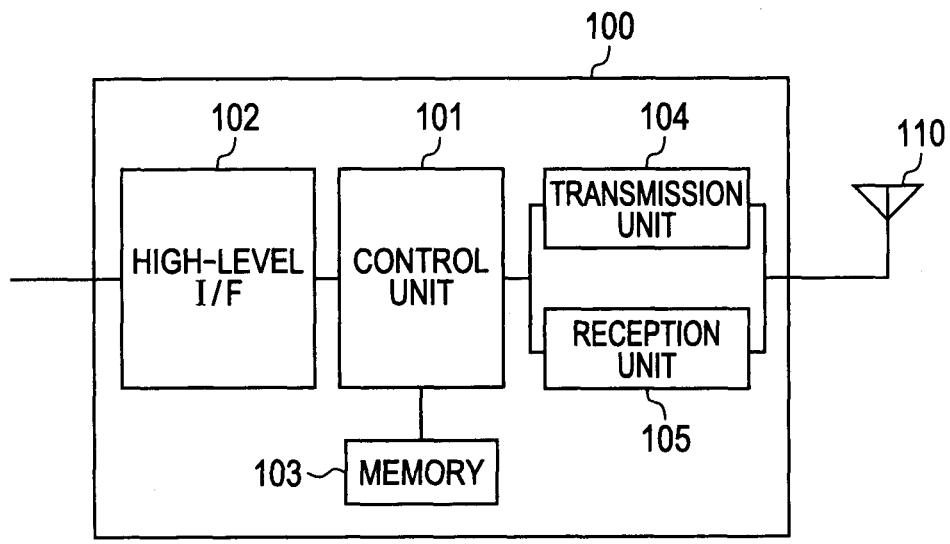
FIG. 9 is a block diagram for showing a structure of an RFID reader/writer 100.

FIG. 9 is a block diagram for showing a structure of the RFID reader/writer 100.

Figure 10:
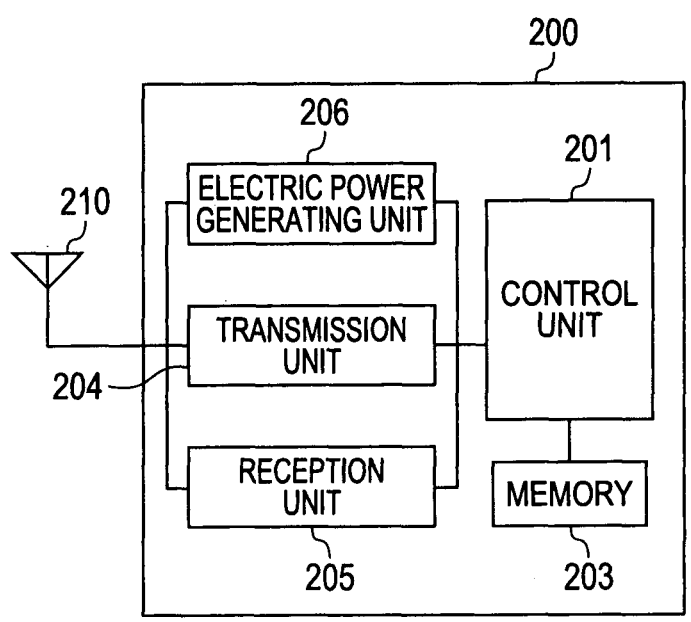
FIG. 10 is a block diagram for showing a structure of the RFID tag 200.

FIG. 10 is a block diagram for showing a structure of the RFID tag 200.

As shown in FIG. 9, the RFID reader/writer 100 includes a control unit 101, a high-level I/F unit 102, a memory 103, a transmission unit 104, and a reception unit 105.

The control unit 101 controls the respective units of the RFID reader/writer 100 in accordance with instructions of the CPU 70 that are input from the high-level I/F 102. Data read from the RFID tag 200 and control information of the RFID reader/writer 100 are stored in the memory 103, and are read by the control unit 101. The transmission unit 104 performs D/A conversion, and transmits electric waves from an antenna 110. The reception unit 105 receives electric waves from the antenna 110 to perform A/D conversion, and transmits data to the control unit 101.

As shown in FIG. 10, the RFID tag 200 includes a control unit 201, a memory 203, a transmission unit 204, a reception unit 205, and an electric power generating unit 206.

The control unit 201 controls the respective units of the RFID tag 200 in accordance with commands of the RFID reader/writer 100 that are input from an antenna 210. The stored information of the RFID tag 200 is stored in the memory 203. The electric power generating unit 206 receives electric waves to generate electric power necessary for operations of the RFID tag 200.

In accordance with commands of the RFID reader/writer 100 that are input from the antenna 210, the control unit 201 reads data from the memory 203, allows the transmission unit 204 to perform D/A conversion, and transmits electric waves from the antenna 210. Alternatively, the control unit 201 receives electric waves from the antenna 210, allows the reception unit 205 to perform A/D conversion, and stores data into the memory 203.

Communications between the RFID reader/writer 100 and the RFID tag 200 are basically performed in accordance with the following procedures.

Transmission of electric waves containing control signals from the antenna 110 of the RFID reader/writer 100

1) The antenna 210 of the RFID tag 200 receives electric waves from the RFID reader/writer 100.
2) The electric power generating unit 206 generates electromotive force (electromagnetic induction or the like) under the resonance effect using the electric waves received from the antenna 210 of the RFID tag 200.

3) The respective circuits are activated by the generated electric power to perform necessary processes.

4) The transmission unit 204 superimposes a signal obtained by modulating a processing result on a carrier to be transmitted from the antenna 210 of the RFID tag 200.

5) The electric waves are received by the antenna 110 of the RFID reader/writer 100.

6) The control unit 101 of the RFID reader/writer 100 performs a decoding process, and transmits the decoded data to the high-level I/F 102.

7) The data are processed by the CPU 70 through the interface 74 of the die bonder.

Next, data structures used for the tool management method of the die bonder according to the first embodiment of the present invention will be described using FIG. 11A to FIG. 12.

FIG. 11A and FIG. 11B are diagrams each showing an example of information held by the RFID tag 200.

FIG. 12 is a diagram for showing an example of a warning level table 500.

Information held by the RFID tag 200 is stored in the memory 203 of FIG. 10. Information for each RFID tag 200 is designed to be stored in the lines of FIG. 11A and FIG. 11B.

"Tag serial No." indicates a unique identifier provided to each RFID tag 200.

"Type of tool" indicates a type of replaceable tool used in the die bonder, and stores "bonding head", "push-up unit", or "preform head" in the embodiment.

"Target product" indicates a product name given to each wafer as a target of the corresponding tool.

"Dimension of die" stores a dimension of the die as a target of the corresponding tool. For example, "5 mm×7 mm" square, or "7 mm×8 mm" square is stored.

"Material" indicates a material used for the corresponding tool. For example, "SUS (stainless)" or "BRS (brass)" is stored.

"Teaching data" is teaching data used at the time of a tool operation in the die bonder. For example, "teaching data" stores information indicating that the tool of "bonding head" is allowed to be moved downward by "5 mm in the Z direction" from a predetermined position to pick up the die.

"Message when mounted" is a message for an operator, such as a mounting method or a caution, that is displayed on the monitor 75 of FIG. 6 when the corresponding tool is mounted in the die bonder. For example, "please screw tightly" or "please be careful of tip breaking" is stored.

Further, although not shown in the drawing, patterns of the shapes of the tools may be stored as data in the RFID in FIG. 11A, so that a mounted tool is imaged by the recognition camera 78 of FIG. 6 to check if the recognition of the tool is correct while being compared with data recognized by the recognition processing unit 73.

The above-described data are set when the tools are shipped.

The following "number of steps", "number of errors", "operating time", and "number of pickup failures" are stored as an operation history when the tools are operated by the die bonder.

"Number of steps" is the number of steps performed by the corresponding tool such as those in which the die is picked up from the wafer to be mounted by the tools of "bonding head" and "push-up unit", and the mounting position of the die is coated with a paste by the tool of "preform head"

"Number of errors" records the number of errors that occurred using the corresponding tool.

"Operating time" stores actual operating hours when the die bonder is operated using the corresponding tool.

"Number of pickup failures" records the number of pickup failures using the tool of "bonding head" or " push-up unit".

On the other hand, a warning level table 500 shown in FIG. 12 is a table in which information for displaying a warning on the monitor 75 is stored for each type of tool after being compared with the operation history recorded in each RFID tag 200. The warning level table 500 is stored in the auxiliary storage device such as the HDD 79, and is loaded to the RAM 71 when being referred to by the CPU 70 of FIG. 6.

The content of "number of steps", "number of errors", "operating time", and "number of pickup failures" corresponds to information stored in each RFID tag 200. "Number of errors", for example, (total number of errors)/(operating days), and "number of pickup failures", for example, (total number of pickup failures)/(operating days) are obtained by calculating the number of times in a predetermined period, and are used to determine whether or not a warning is given.

"Warning level" stores a level of a warning used as an indication of determination for an operator, for example, "A" (low), "B" (mediate), and "C" (high).

Next, an operation model of the tool management method of the die bonder according to the embodiment of the present invention will be described using FIG. 13 to FIG. 16.

Figure 13:
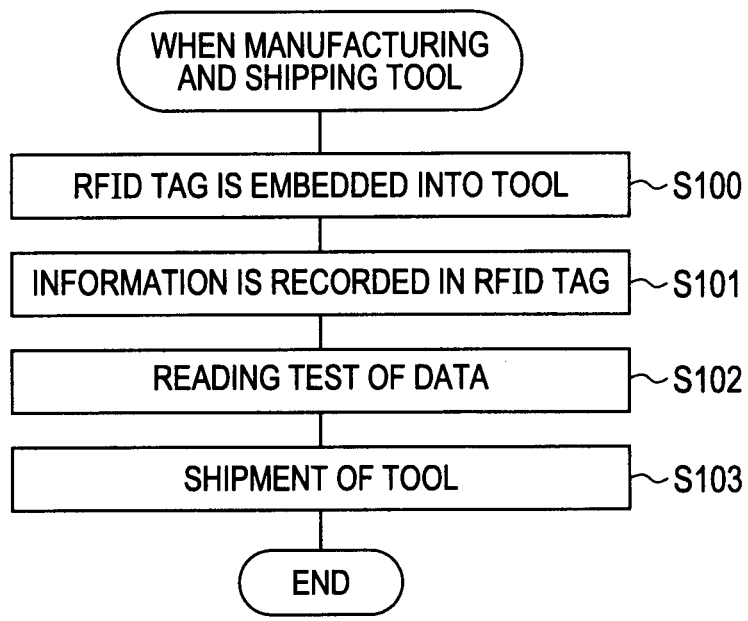
FIG. 13 is a flowchart for showing a process when manufacturing and shipping a tool.

FIG. 13 is a flowchart for showing a process when manufacturing and shipping a tool.

Figure 14:
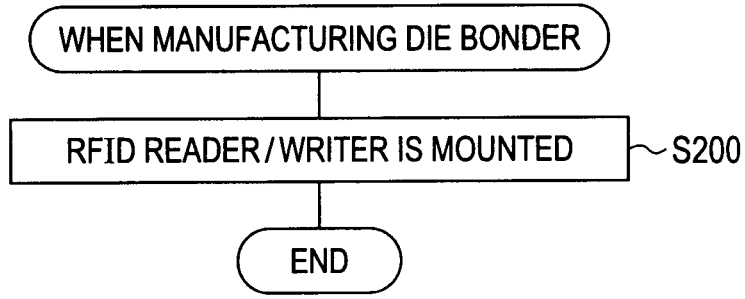
FIG. 14 is a flowchart for showing a process when manufacturing a die bonder.
Figure 15A:
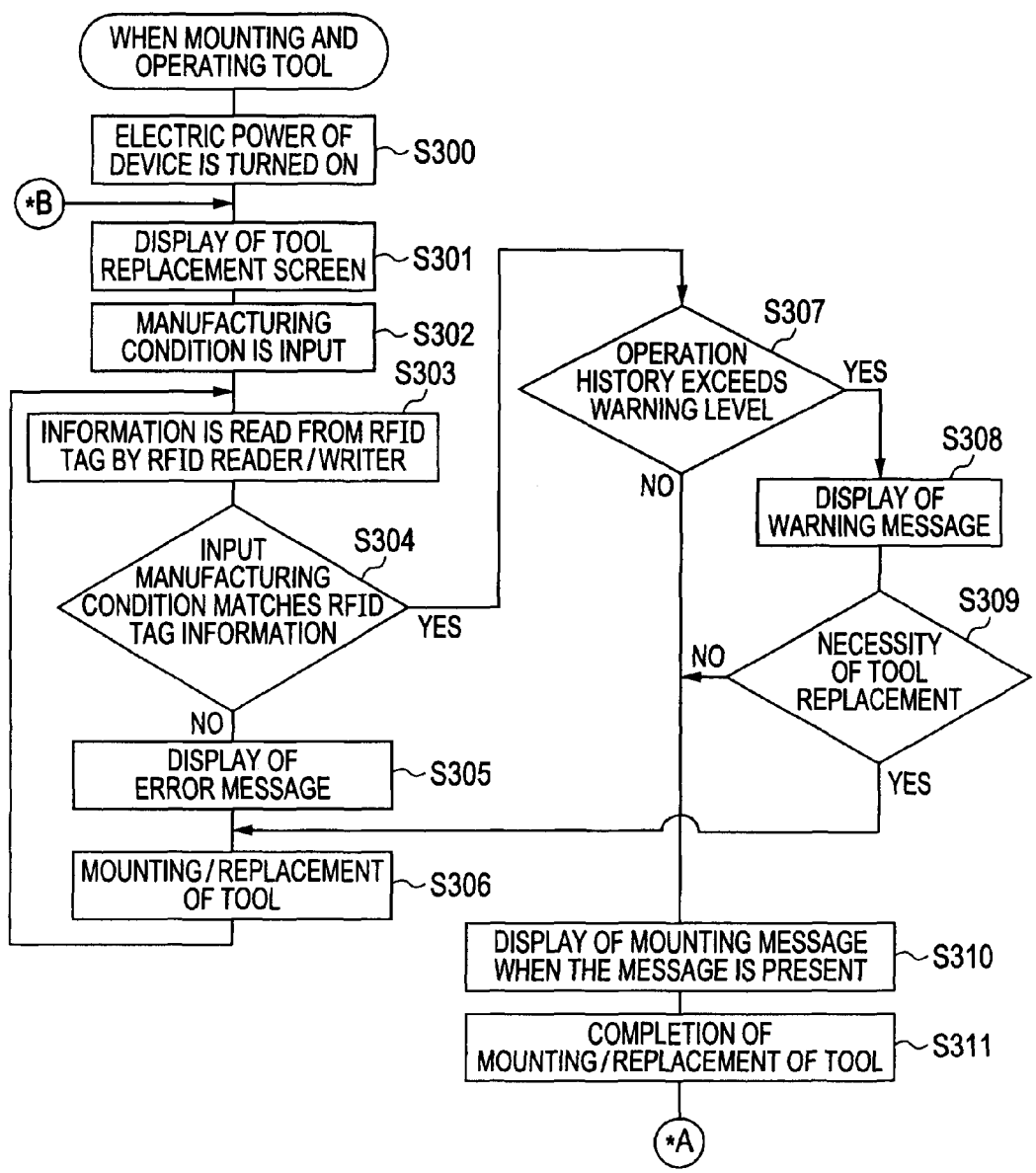
FIG. 15A is a flowchart for showing a process when mounting and operating a tool (part 1)
Figure 15B:
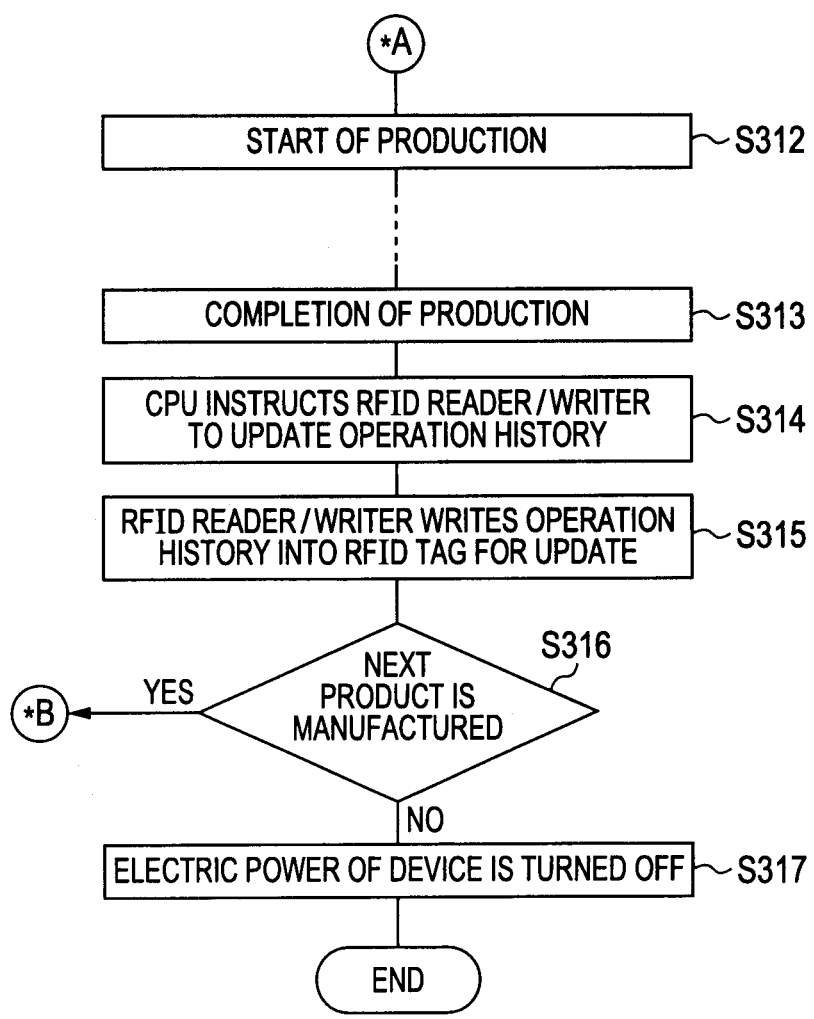
FIG. 15B is a flowchart for showing a process when mounting and operating a tool (part 2)

FIG. 14 is a flowchart for showing a process when manufacturing a die bonder. FIG. 15A and FIG. 15B are flowcharts each showing a process when mounting and operating a tool.

Figure 16:
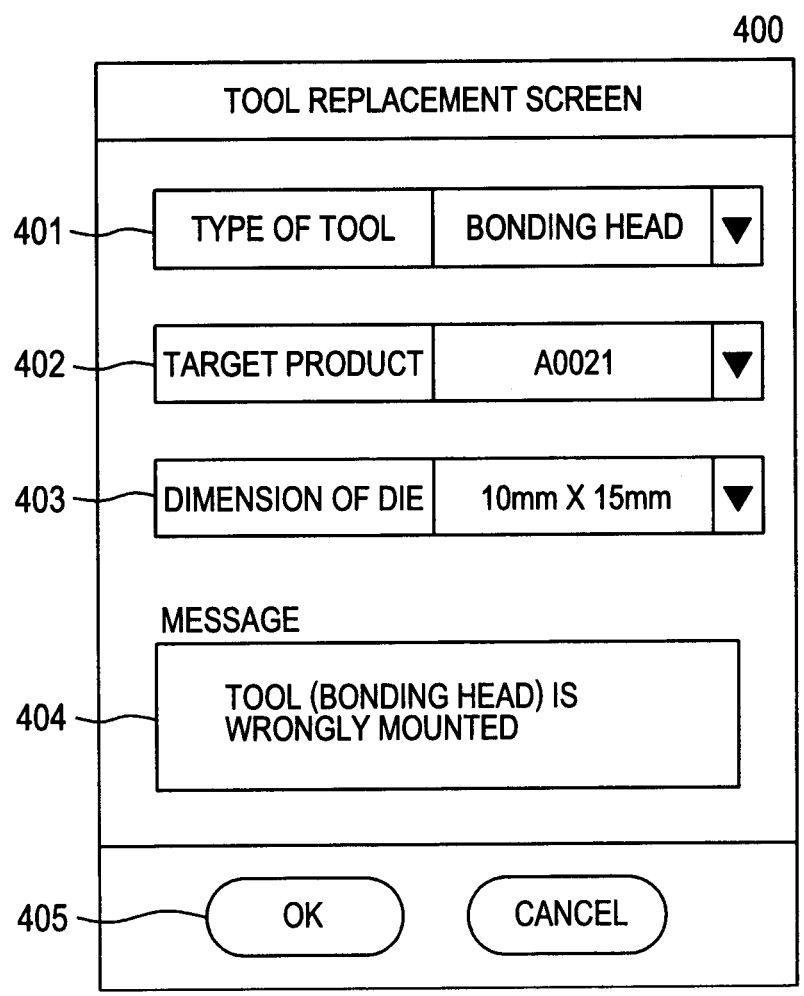
FIG. 16 is a flowchart for showing an example of a tool replacement screen.

FIG. 16 is a flowchart for showing an example of a tool replacement screen.

The tools are replaceable in the die bonder of the embodiment, so that the embodiment assumes a case in which only the tools detached from the die bonder device are shipped to customers.

In the first place, when manufacturing and shipping the tools, the RFID tag 200 is embedded into each tool of the bonding head 60, the push-up unit 50, and the preform head 40 (S100 of FIG. 13). For example, each tool is machine-processed and the RFID tag 200 is attached to each tool.

Next, information at the time of shipment is written into the memory 203 of each RFID tag 200 by the RFID reader/writer 100 coupled to an information processing device such as a personal computer (S101). The information corresponds to "type of tool", "target product", "dimension of die", "material", "teaching data", and "message when mounted" shown in FIG. 11A and FIG. 11B.

Next, the data are read to test whether or not the information has been normally written into each RFID tag 200 (S102).

Then, the tools into which the RFID tags 200 have been embedded are shipped (S103).

On the other hand, when manufacturing the die bonder 1, the RFID reader/writer 100 of FIG. 6 is attached to a die bonder without the normal RFID reader/writer 100, and is coupled to the interface 74 (S200 of FIG. 14).

It should be noted that for the reason of embedding the RFID tags 200 into three types of tools of the bonding head 60, the push-up unit 50, and the preform head 40 in the embodiment, it is necessary to use the RFID reader/writer 100 and the RFID tag 200 in which an anticollision (prevention of collision of communication data) function is provided.

When mounting and operating the tools for mounting the die on a printed substrate, the electric power of the die bonder device is turned on at first (S300 of FIG. 15A).

It should be noted that the following processes of the die bonder are performed in such a manner that the reader/writer control program 300 and the tool management program 301 are stored in the auxiliary storage device such as the HDD 79, and are executed by the CPU 70 after being loaded to the RAM 71.

Next, a tool replacement screen 400 shown FIG. 16 is displayed on the monitor 75 of FIG. 6 (S301).

Then, the operator designates manufacturing conditions using a type-of-tool menu 401, a target-product menu 402, and a dimension-of-die menu 403 on the tool replacement screen 400 through the input device 76 such as a touch panel (S302). In the type-of-tool menu 401, types of tools of the bonding head 60, the push-up unit 50, and the preform head 40 can be selected. In the target-product menu 402, a product name to be processed by each tool can be designated. In the dimension-of-die menu 403, one dimension of a die that is possibly mounted on the printed substrate can be selected.

The RFID reader/writer 100 reads the information stored in the RFID tag 200 of each tool (S303).

Then, it is determined whether or not the input manufacturing conditions match the information read from the RFID tag 200 (S304). If the input manufacturing conditions do not match the information, an error message is displayed in a message column 404 on the tool replacement screen 400 to instruct the operator to mount and replace the tool (S305). It should be noted that "NO" in S304 includes a case in which no tool is attached, specifically, the information cannot be read from the RFID tag 200. If the information cannot be read from the RFID tag 200, a message of "tool (bonding head) is not mounted" is displayed as an error message. If the input manufacturing conditions do not match the information read from the RFID tag 200, a message of "tool (bonding head) is wrongly mounted" may be displayed.

Next, the necessary tool is mounted and replaced (S306), and the flow returns to 5303.

On the other hand, if the input manufacturing conditions match the information read from the RFID tag 200 in S304, the values of the information ("number of steps", "number of errors", "operating time", and "number of pickup failures" of FIG. 11A and FIG. 11B) related to the operation history among pieces of information read from the RFID tag 200 are compared with those of the warning level table of FIG. 12 for determination (S307). When any one of the values exceeds those of the warning level table, an error message such as "operating time of tool (bonding head) exceeds predetermined time (warning level A)" is displayed in the message column 404 on the tool replacement screen 400 (S308).

Then, when it is determined by the operator that the tool needs to be replaced (S309), the flow proceeds to S306.

After the read values are compared with those of the warning level table for determination (S307), if there are no values exceeding those of the warning level table, or if the operator determines that the tool does not need to be replaced (S309), the content of "message when mounted" read from the RFID tag 200 is displayed in the message column 404 on the tool replacement screen 400 as long as "message when mounted" is included (S310).

Then, the operator clicks an OK button 405 on the tool replacement screen 400 to complete the mounting/replacement work of the tool (S311).

Next, the operator instructs to start production of products (S312 of FIG. 15B). For example, although not shown in the drawing, the operator clicks a "production start" button using a main operation screen displayed on the monitor 75.

Then, when the production is completed (S313), the CPU 70 instructs the RFID reader/writer 100 to write the operation history ("number of steps", "number of errors", "operating time", and "number of pickup failures") (S314). The operation history on the die bonder side is automatically stored in the RAM 71 by an operation control program.

The RFID reader/writer 100 updates the information stored in the RFID tag 200 of the corresponding tool on the basis of the values of the input operation history (S315).

Then, if the next product is manufactured (S316), the flow returns to 5301 of FIG. 15A. If not, the electric power of the die bonder 1 is turned off (S317).

As described above in the embodiment, information of each tool is managed and stored in the RFID tag 200, so that it is not necessary to preliminarily register specifications and characteristics of the tools into the die bonder device, and the tools can be easily set up. With advanced lamination of semiconductor chips in the future, it will be necessary to pick up thin chips. Accordingly, the management of tools will become more complicated. In addition, if the information is manually input using a keyboard or the like, inputting errors occur and time is consumed. In the embodiment, the RFID reader/writer 100 reads the information stored in the RFID tag 200 mounted in each tool. Accordingly, such problems can be solved and the tools can be easily managed.

In addition, the RFID reader/writer 100 reads the information stored in the RFID tag 200, and it can be confirmed, by comparison, whether or not the input manufacturing conditions match the tool before completion of production.

Thus, it is possible to prevent occurrence of failures due to wrong mounting of the tool.

Further, the operation conditions of the device such as the teaching data stored in the RFID tag 200 are automatically loaded and set to the die bonder device, so that the productivity and quality can be improved for customers. Specifically, it is possible to shorten setup time by using the teaching data.

Further, the operation history is stored in the RFID tag 200, and is compared with the predetermined number of steps or the like, so that the tools can be used in consideration of wear and deterioration. Specifically, by outputting a warning message to an operator with reference to the operation history, it is possible to preliminarily prevent occurrence of failures in production while avoiding overuse of the tools.

Further, when an unnecessary tool is placed in the die bonder device, it is possible to confirm the presence or absence of the tool with electric waves before production, so that troubles can be prevented in advance.

The operation history stored in the RFID tag 200 can be used as statistic information and basic data for design and development of tools.

Further, "message when mounted" is stored as information stored in the RFID tag 200, so that a tool mounting method and a caution can be announced to an operator.

[Second Embodiment]

In the first embodiment, the operation history is held only by the RFID tag 200.

In a second embodiment, a nonvolatile memory (which may be a semiconductor storage device such as a flash memory, or may be the HDD 79 of FIG. 6) is provided even on the die bonder device side, and the operation history of the device can be stored in the nonvolatile memory.

FIG. 17 is a diagram for showing an example of an operation history table 501.

The operation history table 501 is a table in which "tag serial No.", "type of tool", and the operation history ("number of steps", "number of errors", "operating time", and "number of pickup failures) are recorded. The operation history table 501 is held by the nonvolatile memory such as the HDD 79 of FIG. 6.

"Tag serial No." corresponds to the serial No. of an RFID tag, and is the same as "tag serial No." of FIG. 11A.

"Type of tool" indicates a type of tool, and is the same as "type of tool" of FIG. 11A.

Further, the operation history ("number of steps", "number of errors", "operating time", and "number of pickup failures") is the same as that shown in FIG. 11B.

In the second embodiment, if there are "tag serial No." and "type of tool" corresponding to the record of the operation history table 500 after the process of S315 of FIG. 15B in the first embodiment, the operation history ("number of steps", "number of errors", "operating time", and "number of pickup failures") of the corresponding record is updated on the basis of the operation history input through an operation history input screen.

The tools for the die bonder are sold as consumable supplies in after-sales service. However, some users do not purchase regular tools, but make the tools by themselves or request a third person to make the tools. The quality and accuracy of tools affects the bonding accuracy of a die, leading to production of defective products.

When failures of a die occur, there has been no clear evidence even if the failures were probably caused by the use of irregular tools.

In the embodiment, when regular tools (to which the RFID tags 200 are attached) are used, the operation history for each RFID tag 200 is stored in the operation history table 501, so that it is possible to recognize whether or not irregular tools without RFID tags were used.

Further, customers can use the content of the operation history table 501 as maintenance information of the tools.

[Comprehensive Effect of the Invention by Embodiment]

According to the present invention, it is possible to provide a tool management method of a die bonder in which tools are automatically managed to lighten the work load of an operator, and wrong mounting of the tools is prevented to realize advanced production management in a die bonder in which the tools are replaceable.

What is claimed is:

1. A tool management method of a die bonder in which a part of a preform head by which a printed substrate is coated with a paste to bond a die, a part of a bonding head which picks up the die from a semiconductor wafer to be supplied to the printed substrate, and a part of a push-up unit which pushes up the die from the lower side when the bonding head picks up the die are replaceable as tools, the method comprising:
   (1) a step of attaching an RFID tag to any one of the tool of the preform head, the tool of the bonding head, and the tool of the push-up unit;
   (2) a step of storing, into the RFID tag, information related to each tool to which the RFID tag is attached;
   (3) a step of mounting any one of the tool of the preform head, the tool of the bonding head, and the tool of the push-up unit;
   (4) a step of holding, in a first memory, information of the processing-target die of each tool that is input by an input device;
   (5) a step of reading the information stored in the RFID tag attached to each tool by an RFID reader/writer that reads and writes data from/into the RFID tag using radio waves;
   (6) a step of comparing, by an operational device, the information of the processing-target die of each tool that is held in the first memory with the information related to each tool that is stored in the RFID tag attached to each tool; and
   (7) a step of displaying, if the comparison result in the step (6) shows that the both do not match each other, a determination result related to mounting of each tool on a display device by the operational device.

2. The tool management method of a die bonder according to claim 1, wherein
   the information related to each tool includes any one of a type of tool, a product name of a semiconductor wafer, a dimension of a die, a material of a tool, and a shape of a tool.

3. The tool management method of a die bonder according to claim 1, wherein
   the information related to each tool includes teaching data of each tool, and the operational device refers to the teaching data as data of learning of each tool.

4. The tool management method of a die bonder according to claim 1, wherein
   the information related to each tool includes a message when each tool is mounted, and the operational device displays the read message when each tool is mounted on the display device.

5. The tool management method of a die bonder according to claim 1, further comprising:
   (10) a step of instructing, by the operational device, the RFID reader/writer to write an operation history of each tool into the RFID tag attached to each tool when the production is completed;
   (11) a step of writing, by the RFID reader/writer, the operation history of each tool into the RFID tag attached to each tool on the basis of the instruction of the operational device in the step (10);
   (12) a step of reading the operation history of each tool after executing the step (5);
   (13) a step of comparing, by the operational device, information related to operations of each tool that is held in the first memory with the operation history of each tool stored in the RFID tag attached to each tool; and
   (14) a step of displaying, if the comparison result in the step (13) shows that the values of the operation history exceed those of the information related to the operations of each tool, information related to use of each tool on the display device by the operational device.

6. The tool management method of a die bonder according to claim 1, wherein
   the die bonder collects the operation history of each tool to be held in the first memory,
   the method further comprising
   (20) a step of storing, by the operational device, the operation history of each tool held in the first memory and an identifier of each RFID tag into a second nonvolatile readable/writable memory while they are associated with each other when the production is completed.

7. A die bonder comprising:
   any one or all of a first replaceable tool mounted in a preform head by which a printed substrate is coated with a paste to bond a die, a second tool mounted in a bonding head which picks up the die from a semiconductor wafer to be supplied to the printed substrate that is coated with the paste by the preform head, and a third tool mounted in a push-up unit which pushes up the die from the lower side when the bonding head picks up the die;
   a transmittable/receivable secondary device which is attached to each tool and stores information related to each tool to which the secondary device is attached;

a primary device which can transmit and receive data to/from the secondary device, and reads and writes the information related to each tool stored in the secondary device;

a first memory which stores information related to the die as a processing target of each tool;

an operational device which compares the information related to the die stored in the first memory with the information related to each tool that is read through the primary device and is stored in the secondary device; and a display device which displays a comparison result of the operational device.

8. The die bonder according to claim 7, wherein the information related to each tool includes any one of a type of tool, a product name of a semiconductor wafer, a dimension of a die, a material of a tool, and a shape of a tool.

9. The die bonder according to claim 7, wherein the information related to each tool includes teaching data of each tool, and the operational device refers to the teaching data as data of learning of each tool.

10. The die bonder according to claim 7, wherein the information related to each tool includes a message when each tool is mounted, and the operational device displays the read message when each tool is mounted on the display device.

11. The die bonder according to claim 7, wherein the first memory holds information related to operations of each tool, the secondary device stores an operation history of each tool when the production is completed, the primary device reads and writes the information related to each tool and the operation history stored in the secondary device, and the operational device compares the information related to each tool with the operation history to display information about use of each tool on the display device when the values of the operation history exceed those of the information related to the operations of each tool.

12. The die bonder according to claim 7, wherein the operation history of each tool is collected to beheld in the first memory, the operational device includes a second nonvolatile readable/writable memory, and the operational device stores the operation history of each tool held in the first memory and an identifier of the secondary device into the second memory while they are associated with each other when the production is completed.

13. The die bonder according to claim 7, wherein the secondary device is an RFID tag, and the primary device is an RFID reader/writer.

* * * * *